United States Patent [19]

McCulloch et al.

[11] Patent Number: 5,652,297

[45] Date of Patent: Jul. 29, 1997

[54] AQUEOUS ANTIREFLECTIVE COATINGS FOR PHOTORESIST COMPOSITIONS

[75] Inventors: Iain McCulloch, Murray Hill; Ralph R. Dammel; Dana L. Durham, both of Flemington; Ping-Hung Lu, Bridgewater; Ming Kang, Colonia; Dinesh N. Khanna, Flemington; Shuji Ding, Branchburg, all of N.J.

[73] Assignee: Hoechst Celanese Corporation, Somerville, N.J.

[21] Appl. No.: 699,001

[22] Filed: Aug. 16, 1996

[51] Int. Cl.$^6$ .............. C08F 8/30; C08F 226/00; G03G 13/06
[52] U.S. Cl. .......... 524/555; 526/288; 526/312; 525/327.2; 525/376; 430/97; 430/423; 430/435
[58] Field of Search ............... 524/555; 526/288, 526/312; 430/97

[56] References Cited

U.S. PATENT DOCUMENTS

| | | | |
|---|---|---|---|
| 4,631,328 | 12/1986 | Ringsdorf et al. | 526/312 |
| 5,207,952 | 5/1993 | Griffin, III | 528/289 |
| 5,227,444 | 7/1993 | Muller et al. | 526/312 |
| 5,384,378 | 1/1995 | Etzbach et al. | 526/312 |
| 5,496,899 | 3/1996 | Foll et al. | 525/327.2 |

*Primary Examiner*—Tae Yoon
*Attorney, Agent, or Firm*—Sangya Jain

[57] ABSTRACT

The present invention relates to a novel aqueous antireflective coating solution and a process for its use in photolithography. The antireflective coating solution comprises a novel polymer and water, where the novel polymer of the antireflective coating comprises at least one unit containing a dye that absorbs from about 180 nm to about 450 nm, at least one unit containing a crosslinking group and at least one unit derived from a hydrophilic vinyl monomer or a vinyl monomer capable of becoming hydrophilic.

19 Claims, No Drawings

AQUEOUS ANTIREFLECTIVE COATINGS FOR PHOTORESIST COMPOSITIONS

BACKGROUND OF THE INVENTION

The present invention relates to novel aqueous antireflective coating compositions and their use in forming a thin layer between a reflective substrate and a photoresist coating. Such compositions are especially useful in the fabrication of semiconductor devices by photolithographic techniques.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the minitiarization of semiconductor devices has lead to the use of sophisticated multilevel systems to overcome difficulties associated with such minitiarization. The use of highly absorbing antireflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined by:

$$S = 4(R_1 R_2)^{1/2} e^{-\alpha D}$$

where $R_1$ is the reflectivity at the resist/air or resist/top coat interface, where $R_2$ is the reflectivity at the resist/substrate interface, where $\alpha$ the resist optical absorption coefficient, and D is the film thickness.

Antireflective coating function by absorbing the radiation used in exposing the photoresist, thus reducing $R_2$ and thereby reducing the swing ratio. Reflective notching becomes severe as the photoresist is patterned over substrates containing topographical features, which scatter light through the photoresist film, leading to linewidth variations, and in the extreme case, regions of complete resist loss.

In the past dyed photoresists have been utilized to solve these reflectivity problems. However, it is generally known that dyed resists only reduce reflectivity from the substrate but do not totally eliminate it. In addition, dyed resists also cause reduction in the lithographic performance of the photoresist, together with possible sublimation of the dye and incompatibility of the dye in resist films. In cases where further reduction or elimination of the swing ratio is required, an antireflective coating is applied over the substrate prior to coating with the photoresist and prior to exposure. The resist is exposed imagewise and developed. The antireflective coating in the exposed area is then etched, typically in an oxygen plasma, and the resist pattern is thus transferred to the substrate. The etch rate of the antireflective film should be relatively fast so that the antireflective film is etched without excessive loss of the resist film during the etch process.

Antireflective coatings containing a dye for absorption of the light and an organic polymer to give coating properties are known. However, the possibility of dye sublimation and diffusion of the dye into the photoresist layer make these types of antireflective compositions undesirable.

Polymeric organic antireflective coatings are known in the art as described in EP 583,205 and U.S. Pat. No. 5,525,457 and incorporated herein by reference. However, these antireflective films are cast from organic solvents, such as cyclohexanone and cyclopentanone. The potential hazards of working with organic solvents, have led to the development of the antireflective coating composition of the instant invention, where the solid components of the antireflective coating are both soluble and castable from water. Water based coatings are not only preferred but also provide a distinct advantage in the semiconductor industry. In general, water based coatings do not function well in photolithography, since the development process requires an aqueous alkaline solution which would not only remove the exposed resist but also the aqueous antireflective coating. The coating of the current invention overcomes this difficulty to provide an antireflective film that is water castable and is additionally not removed during the development process. Due to the hydrophilic nature of the polymeric coating, it is additionally resistant to intermixing with the solvent of the photoresist. It also has good dry etching properties, which enable a good image transfer from the resist to the substrate and good absorption characteristics to prevent reflective notching and linewidth variations.

SUMMARY OF THE INVENTION

The present invention relates to a novel aqueous antireflective coating composition and a process for its use in photolithography. The polymer of the antireflective coating composition comprises at least one unit with a dye functionality, at least one unit with a crosslinking group and at least one unit derived from a hydrophilic vinyl monomer or a vinyl monomer capable of becoming hydrophilic. The dye functionality is one that strongly absorbs radiation ranging from about 180 nm (nanometer) to about 450 nm. The preferred types of dyed monomeric units that can be used are defined by the following structure:

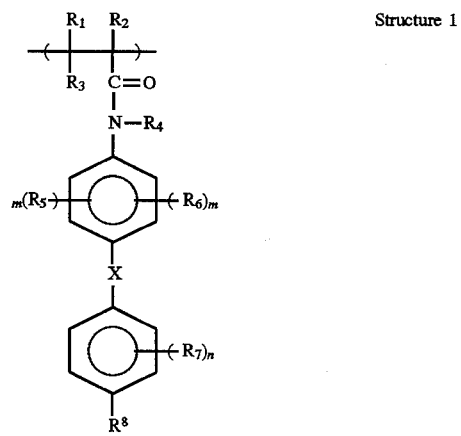

Structure 1 where $R_1$–$R_4$ is H, ($C_1$–$C_4$) alkyl or ($C_1$–$C_4$) alkoxy, $R_5$ is OH, $NH_2$, $OCH_3$ or $OCH_2CH_3$, $R_6$ is H, $(C_1-C_4)$ alkyl or $(C_1-C_4)$ alkoxy, $R_7$ is H, $C_1-C_4$ alkyl or $(C_1-C_4)$ alkoxy, or nitro, $R_8$ is nitro, $SONH_2$, COOY, $SO_3Y$, where Y is H, alkali metal, ammonium or alkyl ammonium, X is a conjugated moiety e.g. N=N, CZ=CZ, CZ=N, N=CZ, where Z is H or $(C_1-C_4)$ alkyl or $(C_1-C_4)$ alkoxy, m=1–3, and n=1–4.

The unit containing the crosslinking group (Y) is defined by the structure,

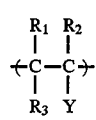

and where the crosslinking groups are typically methylol acrylamides, methacrylamides, ethylene end groups, epoxies, and isocyanates.

The hydrophilic vinyl monomer can have the structure,

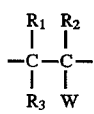

Structure 3 where $R_1-R_3$ is H, $(C_1-C_4)$ alkyl or alkoxy and W is a hydrophilic group, or where the hydrophilic monomer is selected from a group consisting of maleic anhydride, fumaric anhydride, vinyl pyridines and vinyl pyrollidones. The hydrophilic group, W, can be represented by $O(CH_2)_2$—O—$(CH_2)$—OH, $O(CH_2)_2$—OH, $(CH_2)_n$—OH (where n=1–4), $COO(C_1-C_4)$alkyl, COOX, $SO_3X$ (where X is H, alkali metal, ammonium or alkyl ammonium), and $CONHCH_2OH$.

The invention further comprises a process of forming an image on a substrate. The substrate is coated with the film of the antireflective coating of the instant invention and heated to remove any residual solvent and to insolubilize the coating. A film from a photoresist solution is then formed on top of the antireflective coating and further heated to substantially remove the photoresist solvent. The photoresist film is imag3wise exposed through a mask with ultraviolet radiation ranging from about 180 nm to about 450 nm and processed in an aqueous alkaline developer to give a photoresist pattern. The substrate may be heated prior to and after the development step to give an image of superior quality. The exposed antireflective film can then be dry etched, usually in an oxygen plasma, with the photoresist pattern actting as an etch mask.

Since the antireflective coating polymer is soluble in water, this provides the current invention with a distinct advantage over the prior art. The hazards and additional costs associated with organic solvents, such as toxicity of the fumes, transportation of materials and waste disposal are avoided.

DETAILED DESCRIPTION OF THE INVENTION

The antireflective compositions of the present invention comprise a polymer obtained by reacting at least one monomer containing a dye functionality, at least one monomer containing a crosslinking group and at least one monomer containing a hydrophilic group or a group that can become hydrophilic, and where the polymer is water soluble and strongly absorbs ultraviolet light having a wavelength in the range of 180 nm(nanometer) to about 450 nm. The present invention further provides for a process of coating and baking the antireflective coating on a substrate and applying and imaging a photoresist film and the antireflective coating.

The polymer of the instant invention is obtained by reacting at least one vinyl monomer containing a dye functionality, at least one vinyl monomer containing a crosslinking group and at least one vinyl monomer containing a hydrophilic group or a group that can become hydrophilic. The dye groups are ones that strongly absorb radiation ranging from about 180 nm to 450 nm. The preferred types of dyed monomeric units that can be used are defined by the following structure:

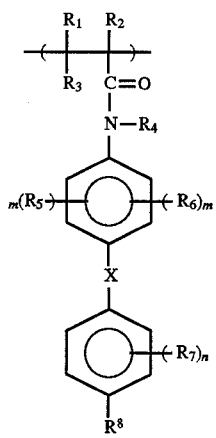

where $R_1-R_4$ is H or $(C_1-C_4)$ alkyl or $(C_1-C_4)$ alkoxy, $R_5$ is OH, $NH_2$, $OCH_3$ or $OCH_2CH_3$, $R_6$ is H, $(C_1-C_4)$ alkyl or $(C_1-C_4)$ alkoxy, $R_7$ is H, $(C_1-C_4)$ alkyl or $(C_1-C_4)$ alkoxy, or nitro,, $R_8$ is nitro, chloro, $SONH_2$, COOY, $SO_3Y$, where Y is H, alkali metal, ammonium or alkyl ammonium, X is a conjugated moiety e.g. N=N, CZ=CZ, CZ=N, N=CZ, where Z is $(C_1-C_4)$ alkyl, H or $(C_1-C_4)$ alkoxy, m=1–3, and n=1–4.

The crosslinking groups present in the antireflective polymer are typically methylol acrylamides, methacrylamides, vinyl end groups, epoxies, isocyanates, but methylol acrylamides and glycidyl methacrylates are preferred. The presence of crosslinking groups in the antireflective film is important to the invention, since the film is essentially water soluble during the coating process, but must be made insoluble in water during the development of the resist, since the developer is an aqueous alkaline solution. Heating the antireflective coating induces crosslinking of the polymer and hence makes the coating insoluble in the aqueous developer. However, the crosslinking functionality must be stable in the aqueous solution of the antireflective polymer and crosslink at temperatures greater than 70° C. The crosslinking vinyl monomeric unit is represented by the following structure:

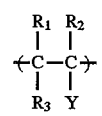

where Y contains the crosslinking functionality and $R_1$ to $R_3$ is H, or $(C_1-C_4)$ alkyl or $(C_1-C_4)$ alkoxy.

Specific examples of crosslinking functionality are shown in the following diagram, but are not limited to these:

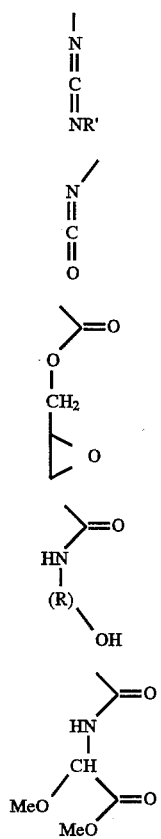

where (1) is a carbodiimide, (2) an isocyanate or blocked equivalent, (3) a glycidyl acrylate or methacrylate, (4) an alkylol acrylamide or methacrylamide and, (5) methyl acrylamidoglycolate methyl ether, R is ($C_1$–$C_4$) alkyl and R' is H or ($C_1$–$C_4$) alkyl.

The hydrophilic monomeric unit that promotes water solubility in the copolymer can be represented by the structure:

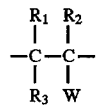

where $R_1$ to $R_3$ is H, ($C_1$–$C_4$) alkyl, ($C_1$–$C_4$) alkoxy and W is a hydrophilic group. Examples of the hydrophilic group, W, are given here but are not limited to these: $O(CH_2)_2$—O—$(CH_2)$—OH, $O(CH_2)_2$—OH, $(CH_2)_n$—OH (where n=1–4), COO($C_1$–$C_4$)alkyl, COOX, $SO_3X$ (where X is H, alkali metal, ammonium, alkyl ammonium), $CONHCH_2OH$. Other hyrodophilic vinyl monomers that can also be used in the polymer are, maleic anhydride, fumaric anhydride, vinyl pyridines, and vinyl pyrollidones.

The antireflective polymer can be synthesized by reacting any number of vinyl monomers containing at least one dye functionality described in Structure 1, any number of vinyl monomers containing at least one crosslinking functionality (Structure 2) and any number of hydrophilic vinyl monomers. Mixtures of different dye monomers, different crosslinking monomers and different hydrophilic monomers can be polymerized to give an antireflective coating with the optimally desired lithographic and physical properties. Other unsaturated monomers can be added to the polymerization mixture that do not greatly effect the function or reduce the aqueous solubility of the antireflective coating. Examples of such unsaturated monomers are, maleic anhydride, vinyl acrylates, vinyl ethers, vinyl acrylamides, vinyl carboxylic acids, vinyl sulphonic acids and N-(3-Hydroxyphenylmethacrylamide). Alternatively, the dye can be functionalized to a copolymer to give the polymer of the current invention.

The antireflective coating composition comprises the polymer of the instant invention and water. Other components may be added to enhance the performance of the coating, e.g. monomeric crosslinking agents, monomeric dyes, lower alcohols, additives, such as acids, to promote crosslinking, additives to promote water solubility of the polymer, surface levelling agents, adhesion promoters, antifoaming agents etc. Crosslinking agents added to the coating formulation must be inert in the coating solvent and thermally activate during the baking step. Examples of these include, but are not limited to, melamines, hydroxy alkyl amides, epoxy and epoxy amine resins, blocked isocyanates, and divinyl monomers.

The process used for polymerization can be any of the ones known in the art for polymerizing vinyl polymers, such as, ionic or free radical polymerization. The polymer structure formed can be composed of alternate, block or random copolymers. The weight average molecular weight ranges from 2,500 to about 1,000,000.

The absorption of the antireflective coating can be optimized for a certain wavelength by the suitable choice of substituents on the dye functionality. Using substituents that are electron-withdrawing or electron donating generally shift the absorption wavelength to longer or shorter wavelengths respectively. Similarily, an appropriate choice of substituents on any of the monomeric units can enhance the aqueous solubility on the crosslinking capability of the polymer.

The polymer of the antireflective coating composition is present in the range of about 1% to about 30% by weight. The exact weight used is dependent on the molecular weight of the polymer and the film thickness of the coating desired. Water is the preferred solvent, although other components may be added to enhance the solubility of the polymer in water, for example, small amounts of alcohols or acetates, providing they are miscible with water.

Since the antireflective film is coated on top of the substrate and is further subject to heating and dry etching it is envisoned that the film is of sufficiently low metal ion content and purity that the properties of the semiconductor device are not adversely effected. Treatments such as passing a solution of the polymer through an ion exchange column, filteration and extraction can be used to reduce the concentration of metal ions and to reduce particles.

The antireflective coating composition is coated on the substrate using techniques well known to those skilled in the art, such as dipping, spincoating or spraying. The film thickness of the antireflective coating ranges from about 0.1 micron to about 1 micron. The coating is further heated on a hot plate or convection oven to remove any residual water and to induce the appropriate amount of crosslinking in order to insolubilize the coating.

Photoresists used to form a film over the antireflective film can be any of the types used in the semiconductor industry as long as the absorption characteristics of the photoactive cmpound in the photoresist matches those of the antireflective coating.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 350 nm to 440 nm.

Photoresists sensitive to short wavelengths, less than 300 nm, can also be used. These resists normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. Nos. 4,491,628, 5,069,997 and 5,350,660.

The process of the instant invention further comprises coating a substrate with the novel antireflective coating and heating on a hotplate or convection oven at a sufficiently high temperature for sufficient length of time to remove the coating solvent and to crosslink the polymer to a sufficient extent so as not to be soluble in the coating solution of the photoresist or in the aqueous alkaline developer. The preferred range of temperature is from about 70° C. to about 250° C. If the temperature is below 70° C. then insufficient loss of solvent or insufficient degree of crosslinking takes place and at temperatures above 250° C. the polymer may become chemically unstable. A film of photoresist is then coated on top of the antireflective coating and baked to substantially remove the photoresist solvent. The photoresist is imagewise exposed and developed in an aqueous alkaline developer to remove the treated resist. An optional heating step can be incorporated into the process prior to development and after exposure. The process of coating and imaging photoresists is well known to those skilled in the art and the processing conditions are optimized for the specific type of resist used. The patterned substrate can then be dry etched in a suitable etch chamber to remove the exposed portions of the antireflective film, with the remaining photoresist acting as an etch mask.

An intermediate layer may be placed between the antireflective coating and the photoresist to prevent intermixing, and is envisioned as lying within the scope of this invention. The intermediate layer is an inert polymer cast from a solvent, where examples of the polymer are polysulfone and polyimides.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Synthesis of N-(3-Hydroxyphenylmethacrylamide)

A suspension of 3-aminophenol (47 g, 0.43 mol) in acetone (100 ml) was chilled to 0° C. To this, a solution of methacrylic anhydride (66.2 g, 0.43 mol) in acetone (150 ml) was added dropwise. A white precipitate formed and the reaction mixture was stirred for 1 hour. The resultant precipitate was poured into crushed ice and the solid product collected by filtration, and recrystallized (1:1 EtOH (ethanol):$H_2O$). The melting point was 172°–173° C. and the yield was 86.6%.

EXAMPLE 2

A solution of N-(3-hydroxyphenylmethacrylamide) (5.32 g, 0.03 mol) from Example 1, in γ butyrolactone (40 ml), was prepared by heating the mixture to 65° C. while stirring. On complete dissolution, the solution was degassed by vigorously bubbling argon, via an inlet needle in a sealed rubber septum, through the solution for up to 2 hours. Previously degassed diethylene glycol monovinyl ether was then injected into the reaction mixture. After an additional 20 minutes, an aliquot from a solution of AIBN (azo-bis-isobutyro-nitrile) (49 mg, 1 mol % total monomers) in γ butyrolactone (1 ml) was also injected. In total, 2 aliquots were added at intervals of 6 hours. Both inlet and outlet needles were then removed and the sealed vessel was allowed to stir at 65° C. for 18 hours. The resultant solution was then precipitated into ethyl acetate (300 ml) as nonsolvent, and the solid collected by filtration, redissolved in ethanol (50 ml) and reprecipitated into ethyl acetate. Purification was further carried out by successive reprecipitations of polymer solution until no monomer was observed by TLC. The polymer formed as a white powder and was dried under reduced pressure overnight.

EXAMPLE 3

The diazonium salt of sulfanilic acid was prepared as follows. To a solution of tetramethyl ammonium hydroxide in water (25% solids) (3.6 ml, 0.01 mol) was added sulfanilic acid (1.73 g, 0.01 mol), followed by isobutyl nitrite (1.5 ml. 0.012 mol) and the resultant suspension temperature maintained below 10° C. A solution of HCl (37.8 wt % in water) (1.62 ml, 0.02 mol) was added to water (5 ml) and the solution slowly added to the reaction mixture, forming the diazonium salt.

EXAMPLE 4

The copolymer from Example 2 (3.09 g, 0.01 mol equiv. phenylacrylamide) was dissolved in ethanol (30 ml), then on addition of tetramethyl ammonium hydroxide in water (25 wt % solids) (7.2 ml, 0.02 mol), the immediate precipitate that formed was gradually redissolved. Additional water (5 ml) and ethanol (10 ml) were then added and the solution chilled to 5° C. The diazonium salt prepared from Example 3 was then added dropwise to the polymer solution, which immediately formed a suspension. Additional water was added throughout the course of the addition (20 ml total) and the mixture allowed to stir. Gradually the suspension was converted to an orange solution (4 hours) which was filtered and the subsequent solution precipitated into 2-propanol (700 ml) as nonsolvent. The product was collected by filtration and purified by reprecipitation.

EXAMPLE 5

11.96 g (0.0675 mol) of N-(3-hydroxyphenylmethacrylamide) from Example 1 was dissolved in γ butyrolactone (75 ml) and DMF (dimethylformamide) (75 ml), The mixture was heated to 65° C. while stirring. The solution was degassed by vigorously bubbling argon, via an inlet needle in sealed rubber septum, through the solution for 1 hour. 4.41 ml (0.0225 mol) of N-(hydroxymethyl)acrylamide and 6.48 ml (0.06 mol) methyl methacrylate were injected into the solution. The solution was degassed for 0.5 hour. An aliquot from a solution of AIBN (0.251 g, 1.5 mmol, 1 mol % total monomer) in γ butyrolactone (2 ml) was injected and degassed for 0.5 hour. In total, 2 aliquots were added at intervals of 4 hours. Both the inlet and outlet needles were removed and the sealed vessel was stirred at 65° C. for 19 hours.

EXAMPLE 6

4.68 g (0.03375 mol) of 4-aminobenzoic acid were dissolved in 6.68 ml (0.084375 mol) of concentrated hydrochloric acid and 70 ml of water, contained in a 250 ml three-neck round-bottom flask. A thermometer was placed in the solution and the flask immersed in a bath of crushed ice, cooled until the temperature of the solution fell below 2° C. The solution contained a white suspension. Diazotization was done by the addition of 4.19 ml (0.0338 mol) tert-butyl nitrite. The diazonium solution was stirred in ice-water for about 1 hour. The suspension changed to a yellow solution.

EXAMPLE 7

80 ml (0.075 mol) of the polymer solution from Example 5 was placed in a 500 ml round bottomed flask. To this was added 320 ml of DMF and a solution of (25% in water) 42.52 ml (0.1185 mol) tetramethylammonium hydroxide while stirring. The solution was cooled in an ice-water bath to 10° C. and the cold diazonium salt solution was added. The solution changed to orange color. The mixture was allowed to stir about 3 hours and warmed to room temperature. The resultant solution was precipitated into excess isopropanol, and the polymer collected by filtration and vacuum dried.

EXAMPLE 8 (COMPARATIVE)

Several 4" wafers were coated with AZ® 7805 (available from Hoechst Celanese Corporation, 70 Meister Ave., Somerville, N.J. 08876) and baked using a temperature of 90° C. for 90 seconds to give thickness from 0.5 μm (micrometers) to 0.9 μm (micrometers). These wafers were imagewise exposed with a NIKON® 0.54 NA i-line stepper using a clear quartz as the reticle and a program that directed the stepper to print a 11×11 exposure matrix with dose increments of 2 mJ/cm$^2$. The exposed wafers were baked at 110° C. for 60 seconds and puddle developed with AZ® 300 MIF developer (available from Hoechst Celanese Corporation, 70 Meister Ave., Somerville, N.J. 08876) for 35 seconds. The minimum dose required to clear the film was plotted as a function of the corresponding resist thickness, a sinusoidal curve was obtained, called the swing curve. The % Swing ratio was calculated empirically by the following equation:

$$\% \text{ Swing Ratio} = (E_{max} - E_{min})/((E_{max} + E_{min})/2) \times 100$$

where Emax and Emin corresponding to the dose-to-clear the resist film thickness at the maximum and minimum energy on a swing curve. The smaller the value of % Swing Ratio the lower is the impact of reflectivity and the better is linewidth control over reflective substrate or topography.

The % Swing Ratio for AZ® 7805 was 34.8%.

EXAMPLE 9

The polymer from Example 4 was dissolved in water to give a 5 weight % solution. The polymer solution was spin coated on several 4" silicon wafers, and baked on a hot plate at 220° C. for 60 seconds to give a thickness of 0.121 micron. The wafers were then coated with with AZ® 7805 (available from Hoechst Celanese Corporation, 70 Meister Ave., Somerville, N.J. 08876) and baked using a temperature of 90° C. for 90 seconds to give thickness from 0.5 μm (micrometers) to 0.9 μm (micrometers). These wafers were imagewise exposed with a NIKON® 0.54 NA i-line stepper using a clear quartz as the reticle and a program that directed the stepper to print a 11×11 exposure matrix with dose increments of 2 mJ/cm$^2$. The exposed wafers were baked at 110° C. for 60 seconds and puddle developed with AZ® 300 MIF developer for 35 seconds. The minimum dose required to clear the film was plotted as a function of the corresponding resist thickness, and a sinusoidal curve was obtained, called the swing curve. The % Swing Ratio was calculated as in Example 8.

The % Swing Ratio for AZ® 7805 with antireflective polymer coating of this Example was 22%, showing a reduction in the % Swing Ratio from the resist without the antireflective coating.

EXAMPLE 10

The polymer from Example 7 was dissolved in water to give a 5 weight % solution. The polymer solution was spin coated on several 4" silicon wafer, and baked on a hot plate at 220° C. for 60 seconds to give a thickness of 0.198 micron. The wafers were then coated with with AZ® 7805 (available from Hoechst Celanese Corporation, 70 Meister Ave., Somerville, N.J. 08876) and baked using a temperature of 90° C for 90 seconds to give thickness from 0.5 μm (micrometers) to 0.9 μm (micrometers). These wafers were imagewise exposed with a NIKON® 0.54 NA i-line stepper using a clear quartz as the reticle and a program that directed the stepper to print a 11×11 exposure matrix with dose increments of 2 mJ/cm$^2$. The exposed wafers were baked at 110° C. for 60 seconds and puddle developed with AZ® 300

MIF developer for 35 seconds. The minimum dose required to clear the film was plotted as a function of corresponding resist thickness, and a sinusoidal curve was obtained, called the swing curve. The % Swing Ratio was calculated as in Example 8.

The % Swing Ratio for AZ® 7805 with antireflective polymer coating of this Example was 2.1%, showing a significant reduction in the % Swing Ratio from the resist without the antireflective coating.

We claim:

1. An aqueous antireflective coating composition for use in photolithography, comprising water and a polymer containing:

a) at least one dye unit having the structure:

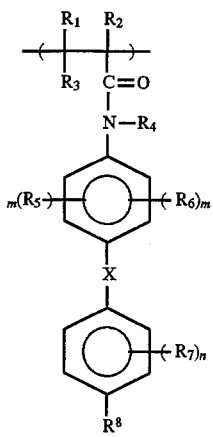

where
$R_1$–$R_4$ is H, ($C_1$–$C_4$) alkyl or ($C_1$–$C_4$) alkoxy,
$R_5$ is OH, $NH_2$, $OCH_3$ or $OCH_2CH_3$,
$R_6$ is H, ($C_1$–$C_4$) alkyl or ($C_1$–$C_4$) alkoxy,
$R_7$ is H, ($C_1$–$C_4$) alkyl or ($C_1$–$C_4$) alkoxy, or nitro,
$R_8$ is nitro, $SONH_2$, COOY, $SO_3Y$, where Y is H, alkali metal, ammonium or alkyl ammonium,
X is a conjugated moiety e.g. N=N, CZ=CZ, CZ=N, N=CZ, where Z is H, ($C_1$–$C_4$) alkyl or ($C_1$–$C_4$) alkoxy,
m=1–3, and n=1–4;

b) at least one unit having the structure

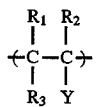

where
$R_1$–$R_4$ is H, ($C_1$–$C_4$) alkyl or ($C_1$–$C_4$) alkoxy and Y contains a crosslinking group; and c) at least one unit derived from a hydrophilic vinyl monomer or a vinyl monomer capable of becoming hydrophilic.

2. The aqueous antireflective composition according to claim 1, where the hydrophilic vinyl monomer has the structure:

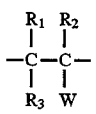

where $R_1$–$R_3$ is H, ($C_1$–$C_4$) alkyl or ($C_1$–$C_4$) alkoxy and W is a hydrophilic group.

3. The aqueous antireflective composition according to claim 2, wherein the hydrophilic group is selected from a group consisting of $O(CH_2)_2$—O—$(CH_2)$—OH, $O(CH_2)_2$—OH, $(CH_2)_n$—OH (where n=1–4), COO($C_1$–$C_4$)alkyl, COOX, $SO_3X$ (where X is H, alkali metal, ammonium, alkyl ammonium) and $CONHCH_2OH$.

4. The aqueous antireflective composition according to claim 1, where the hydrophilic vinyl monomer is selected from a group consisting of maleic anhydride, fumaric anhydride, vinyl pyridines, and vinyl pyrollidones.

5. The aqueous antireflective composition according to claim 1, wherein the crosslinking group is selected from a group consisting of carbodiimide, isocyanate, blocked isocyanate, glycidyl methacrylate, alkylol acrylamide, alkylol methacrylamide and methyl acrylamidoglycolate.

6. The aqueous antireflective composition according to claim 1, wherein X in the dye unit is an azo group.

7. The aqueous antireflective composition according to claim 1, further comprising a water miscible alcohol or acetate.

8. The aqueous antireflective composition according to claim 1, wherein the dye unit ranges from about 5 to about 95 mole percent, the crosslinking unit ranges from about 1 to about 50 mole percent and the hydrophilic vinyl monomer ranges from about 1 to about 50 mole percent of the polymer.

9. The aqueous antireflective composition according to claim 1, wherein the polymer further comprises one or more vinyl monomers that are nonabsorbing, noncrosslinking and nonhydrophilic.

10. The aqueous antireflective composition according to claim 1, wherein the composition further comprises a crosslinking agent.

11. The aqueous antireflective composition according to claim 1, wherein the composition further comprises a dye.

12. The antireflective composition according to claim 1, wherein the polymer has a weight average molecular weight in the range of about 2,500 to about 1,000,000.

13. The antireflective composition according to claim 1, wherein the metal ion level is less than 50 ppb each metal ion.

14. The process of forming an image on a substrate comprising the steps of:
a) coating the substrate with the antireflective coating composition of claim 1,
b) heating the antireflective coating,
c) coating a photoresist solution on the substrate,
d) heating the photoresist coating to substantially remove solvent from the coating,
e) imagewise exposing the photoresist coating,
f) developing an image using an aqueous alkaline developer,
g) optionally, heating the substrate prior to and after development,
h) dry etching the antireflective coating.

15. The process of claim 14, wherein the photoresist solution comprises a novolak resin, a photosensitive compound and a solvent.

16. The process of claim 14, wherein the photoresist solution comprises a substituted polyhydroxystyrene, a photoactive compound and a solvent.

17. The process of claim 14, wherein the photoresist solution comprises polyhydroxystyrene, a photoactive compound, a dissolution inhibitor and a solvent.

18. The process of claim 14, wherein the heating temperature for hardening of the antireflective coating ranges from about 70° C. to about 250° C.

19. The process of claim 14, wherein the aqueous alkaline developer comprises tetramethyl ammonium hydroxide.

* * * * *